(12) United States Patent
Akram et al.

(10) Patent No.: US 6,246,245 B1
(45) Date of Patent: *Jun. 12, 2001

(54) PROBE CARD, TEST METHOD AND TEST SYSTEM FOR SEMICONDUCTOR WAFERS

(75) Inventors: Salman Akram; C. Patrick Doherty, both of Boise; Warren M. Farnworth, Nampa; David R. Hembree, Boise, all of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/027,880

(22) Filed: Feb. 23, 1998

(51) Int. Cl.[7] ................................................. G01R 31/02
(52) U.S. Cl. ................................................. 324/754; 324/761
(58) Field of Search ................................... 324/754, 757, 324/761, 755

(56) References Cited

U.S. PATENT DOCUMENTS

| | | | |
|---|---|---|---|
| 4,585,991 | 4/1986 | Reid et al. ........................ 324/158 P |
| 5,042,148 | 8/1991 | Tada et al. ........................... 29/852 |
| 5,172,050 | 12/1992 | Swapp ............................. 324/158 P |
| 5,177,439 | 1/1993 | Liu et al. ......................... 324/158 P |
| 5,180,977 | 1/1993 | Huff ................................ 324/158 P |
| 5,225,037 | 7/1993 | Elder et al. .......................... 156/644 |
| 5,412,329 | * 5/1995 | Iino et al. ............................ 324/754 |
| 5,495,667 | 3/1996 | Farnworth et al. .................... 29/843 |
| 5,604,443 | * 2/1997 | Kitamura et al. ..................... 324/754 |
| 5,606,263 | * 2/1997 | Yoshizawa et al. ................... 324/757 |
| 5,623,213 | * 4/1997 | Liu et al. ............................. 324/754 |
| 5,703,494 | * 12/1997 | Sano .................................. 324/754 |
| 5,825,192 | * 10/1998 | Hagihara ............................ 324/757 |
| 5,847,571 | * 12/1998 | Liu et al. ............................ 324/754 |
| 5,869,974 | 2/1999 | Akram et al. . |
| 5,894,161 | 4/1999 | Akram et al. . |
| 5,915,977 | 6/1999 | Hembree et al. . |
| 5,931,685 | 8/1999 | Hembree et al. . |
| 5,952,843 | * 9/1999 | Vinh .................................. 324/754 |
| 5,974,662 | * 11/1999 | Eldridge et al. ..................... 324/754 |
| 5,982,183 | * 11/1999 | Sano .................................. 324/754 |
| 6,060,891 | 5/2000 | Hembree et al. . |
| 6,072,321 | 6/2000 | Akram et al. . |
| 6,078,186 | * 6/2000 | Hembree et al. ..................... 324/755 |
| 6,097,087 | 8/2000 | Farnworth et al. . |
| 6,107,109 | 8/2000 | Akram et al. . |
| 6,114,240 | 9/2000 | Akram et al. . |

OTHER PUBLICATIONS

Science Over Art. Our New IC Membrane Test Probe., Packard Hughes Interconnect, technical brochure, (No Month Available), 1993.

\* cited by examiner

*Primary Examiner*—Safet Metjahic
*Assistant Examiner*—Jermele M. Hollington
(74) *Attorney, Agent, or Firm*—Stephen A. Gratton

(57) ABSTRACT

A probe card for testing a semiconductor wafer, a test method, and a test system employing the probe card are provided. The probe card includes: a substrate; patterns of pin contacts slidably mounted to the substrate; and a force applying member for biasing the pin contacts into electrical contact with die contacts on the wafer. In an illustrative embodiment the force applying member includes spring loaded electrical connectors in physical and electrical contact with the pin contacts. Alternately, the force applying member includes a compressible pad for multiple pin contacts, or separate compressible pads for each pin contact. A penetration depth of the pin contacts into the die contacts is controlled by selecting a spring force of the force applying member, and an amount of Z-direction overdrive of the pin contacts into the die contacts.

16 Claims, 4 Drawing Sheets

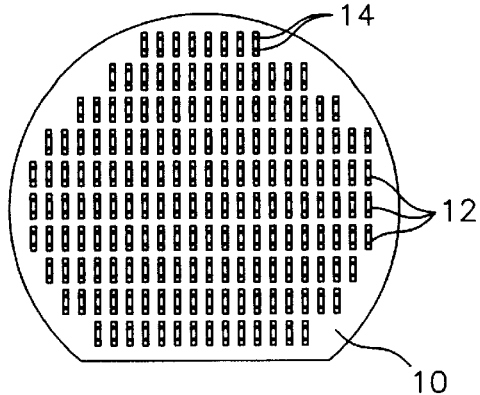
FIGURE 1
(PRIOR ART)
FIGURE 2
(PRIOR ART)
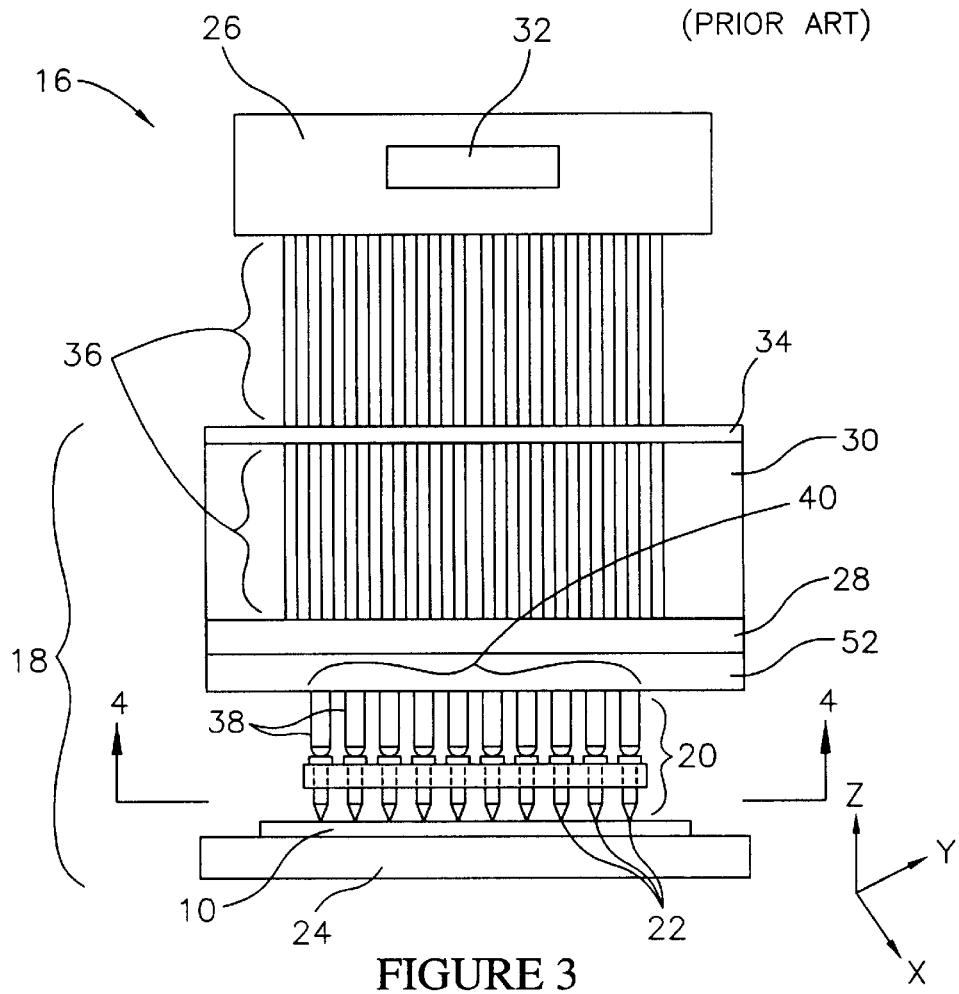
FIGURE 3

PROVIDE A WAFER HANDLER 18 AND TESTER 26 FOR APPLYING TEST SIGNALS FOR TESTING SEMICONDUCTOR DICE 12 CONTAINED ON A WAFER 10.

PROVIDE A PROBE CARD 20 FOR THE WAFER HANDLER 18 HAVING SLIDABLY MOUNTED PIN CONTACTS 22 AND A FORCE APPLYING MEMBER 40 FOR BIASING THE PIN CONTACTS 22.

LOAD THE WAFER 10 INTO THE WAFER HANDLER 18.

ALIGN DIE CONTACTS 14 ON THE WAFER 10 WITH THE PIN CONTACTS 22 ON THE PROBE CARD 20 BY MOVING THE WAFER 10 OR THE PROBE CARD 20 IN X AND Y DIRECTIONS.

MOVE THE WAFER 10 OR THE PROBE CARD 20 IN THE Z-DIRECTION TO PLACE THE DIE CONTACTS 14 AND THE PIN CONTACTS 22 IN PHYSICAL CONTACT

OVERDRIVE THE WAFER 10 OR THE PROBE CARD 20 IN THE Z-DIRECTION BY A SELECTED DISTANCE SO THAT THE PIN CONTACTS 22 PENETRATE THE DIE CONTACTS 14 UNDER BIASING FROM THE FORCE APPLYING MEMBER 40.

COMPRESS THE FORCE APPLYING MEMBER 40 BY THE SELECTED DISTANCE TO EXERT A DESIRED FORCE ON THE PIN CONTACTS 22 FOR PENETRATING THE DIE CONTACTS 14 TO A LIMITED PENETRATION DEPTH.

TRANSMIT TEST SIGNALS THROUGH PIN CONTACTS 22 TO DIE CONTACTS 14.

FIGURE 8

PROBE CARD, TEST METHOD AND TEST SYSTEM FOR SEMICONDUCTOR WAFERS

FIELD OF THE INVENTION

This invention relates to testing of semiconductor dice contained on a wafer. More particularly, this invention relates to an improved probe card, and to a test method and test system employing the probe card.

BACKGROUND OF THE INVENTION

Semiconductor wafers are tested prior to singulation into individual die, to assess the electrical characteristics of the integrated circuits contained on each die. A typical wafer-level test system includes a wafer handler for handling and positioning the wafers, a tester for generating test signals, a probe card for making temporary electrical connections with the wafer, and a prober interface board for routing signals from the tester pin electronics to the probe card.

The test signals can include specific combinations of voltages and currents transmitted through the pin electronics channels of the tester to the prober interface board, through the probe card, and then to one or more devices under test on the wafer. During the test procedure response signals such as voltage, current and frequency can be analyzed and compared by the tester to required values. The integrated circuits that do not meet specification can be marked or mapped in software. Following testing, defective circuits can be repaired by actuating fuses (or anti-fuses) to inactivate the defective circuitry and substitute redundant circuitry.

One type of probe card includes needle probes for making temporary electrical connections with die contacts on the dice (e.g., bond pads, fuse pads, test pads). The probe card typically includes an insulating substrate, such as a glass filled resin. The substrate can include electric traces in electrical communication with the needle probes. In addition, the needle probes can be configured to make electrical connections with a specific die, or groups of dice, on the wafer. Typically, the wafer or the probe card is stepped so that the dice on the wafer are tested in sequence.

One aspect of these testing procedures, is that the die contacts on the wafer are typically coated with a metal oxide layer. For example, aluminum bond pads can be covered with an aluminum oxide layer that forms by oxidation of the underlying metal. The oxide layer is electrically non conductive, and provides a high degree of electrical resistance to the needle probes. In order to ensure accurate test results, the needle probes must penetrate the oxide layer to the underlying metal.

To penetrate oxide layers on die contacts, the probe card and wafer can be brought together until the needle probes touch the die contacts. The probe card can then be over-driven a distance in the z-direction (e.g., 3 mils) causing the needle probes to bend. As the needle probes bend, their tips move horizontally across the die contacts, scrubbing through the oxide layers to the underlying metal. This scrubbing action also displaces some of the underlying metal causing grooves and corresponding ridges to form on the die contacts.

Due to their inherently fragile nature and mode of use, probe cards with needle probes require a significant amount of cleaning, alignment, and replacement. Another shortcoming of needle probe cards, is the needle probes cannot be fabricated with a density which permits testing of high pin count devices having dense arrays of die contacts. For example, fabricating probe needles with a pitch of less than about 6 mils has been difficult.

In view of the foregoing, it would be advantageous to provide a probe card which is capable of accurately probing dense arrays of closely spaced die contacts on semiconductor wafers. It would also be advantageous to provide a probe card which is relatively simple to construct and maintain. Still further, it would be advantageous for a probe card to include contacts that are more robust than needle probes, and which can move in a z-direction to accommodate penetration of oxide layers on the die contacts.

SUMMARY OF THE INVENTION

In accordance with the present invention, an improved probe card for testing semiconductor wafers is provided. Also provided are testing methods, and testing systems employing the probe card. The probe card, simply stated, comprises: a substrate; patterns of pin contacts slidably mounted to the substrate; and a force applying member for biasing the pin contacts into electrical engagement with die contacts on the wafer.

The substrate comprises a material such as ceramic, silicon, photosensitive glass-ceramic, or glass filled resin, which can be etched, machined or molded with patterns of densely spaced openings. The pin contacts are mounted within the openings, one pin contact per opening. The size and pitch of the openings and pin contacts, permits testing of dice having dense arrays of die contacts. In addition, the pin contacts are capable of Z-direction axial movement within the openings, to permit oxide layers on the die contacts to be penetrated, and to accommodate differences in the vertical locations of the die contacts. The pin contacts can include pointed tip portions for penetrating the die contacts, and enlarged head portions for making electrical connections with the pin contacts.

The force applying member applies a biasing force to the pin contacts. The biasing force can be controlled such that the pin contacts penetrate the die contacts to a limited penetration depth. Several different embodiments for the force applying member are provided. In a first embodiment, the force applying member comprises spring loaded electrical connectors, such as "POGO PINS", which engage the head portions of the pin contacts. The electrical connectors mount to a support plate attached to a test head wherein the probe card is mounted. In this embodiment the electrical connectors provide both the biasing force, and the external electrical connections to the pin contacts. A biasing force exerted by the electrical connectors is dependent on a spring constant, and compression, of a spring component of the electrical connectors. In addition, the biasing force is dependent on the amount by which the pin contacts are overdriven into the die contacts past the initial point of contact.

In a second embodiment, the force applying member comprises a compressible pad mounted to the substrate for biasing the head portions of multiple pin contacts. In this embodiment a separate interconnect layer, such as a flex circuit, can be provided for fanning out electrical paths from the pin contacts, to accommodate larger pitches for electrical connections to the pin contacts.

In a third embodiment, the openings in the substrate have closed ends, and the force applying member comprises separate compressible pads mounted within the openings in physical contact with the pin contacts. In this embodiment the openings can include internal contacts which make electrical connections to the pin contacts and to the outside. Alternately, the compressible pad can comprise an electrically conductive polymer which physically and electrically contacts the pin contacts.

A test system constructed in accordance with the invention includes the probe card mounted to a conventional wafer handler. The wafer handler is adapted to align the pin contacts on the probe card to the die contacts on the wafer, and to bring the wafer and probe card in contact with a desired amount of Z-direction overdrive of the pin contacts into the die contacts. The test system also includes a tester in electrical communication with the probe card. The tester is adapted to transmit test signals through the probe card to the dice contained on the wafer, and to analyze resultant test signals.

BRIEF DESCRIPTION OF THE DRAWINGS

FIG. 1 is a plan view of a prior art semiconductor wafer containing multiple semiconductor dice;

FIG. 2 is a plan view of a prior art semiconductor die illustrating die contacts on an individual die on the wafer;

FIG. 3 is a schematic cross sectional view of a test system constructed in accordance with the invention;

FIG. 8 is a block diagram of a testing method in accordance with the invention.

DETAILED DESCRIPTION OF THE PREFERRED EMBODIMENT

Figure 4:
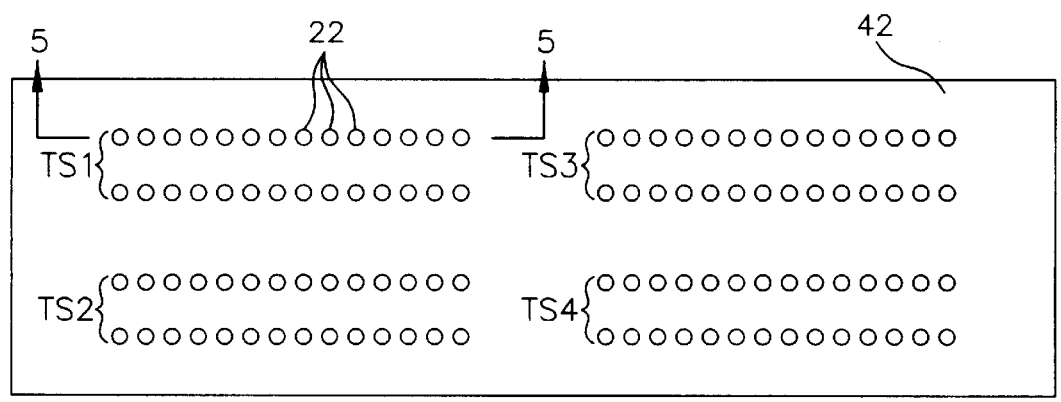
FIG. 4 is an enlarged cross sectional view taken along section line 4—4 of FIG. 3 illustrating a probe card constructed in accordance with the invention.

Referring to FIGS. 1 and 2, a prior art semiconductor wafer 10 includes multiple semiconductor dice 12 fabricated using processes that are well known in the art. As shown in FIG. 2, each die 12 includes multiple die contacts 14. The die contacts 14 comprise bond pads in electrical communication with integrated circuits contained on the die 12. For illustrative purposes, each die 12 includes twenty eight die contacts 14. However, as is apparent, this number of die contacts 14 is merely exemplary. In addition, although the die contacts 14 are illustrated as bond pads, they can also be dedicated test pads, or fuse pads, located on the dice 12, or on other portions of the wafer 10.

Referring to FIG. 3, a test system 16 constructed in accordance with the invention is shown. The test system 16 is configured to test the dice 12 contained on the wafer 10. The test system 16 includes a probe card 20 having pin contacts 22 configured to make temporary electrical connections with the die contacts 14. The test system 16 also includes a wafer handler 18 wherein the probe card 20 is mounted, and a tester 26 having test circuitry 32 configured to apply test signals through the test head 30 and pin contacts 22 to the die contacts 14, and to analyze the resultant signals.

The wafer handler 18 interfaces with a test head 30 wherein the probe card 20 is mounted. In addition, the wafer handler 18 includes a wafer chuck 24 configured to move in X and Y directions to align the wafer 10 with the probe card 20, and in the Z direction to move the wafer 10 into contact with the probe card 20. One suitable wafer handler 18 is manufactured by Electroglass and is designated a Model 4080.

The test system 16 also includes a prober interface board 28 for routing test signals from the tester 26 to the test head 30 to the probe card 20. The prober interface board 28 can be mounted to the test head 30. In addition, the prober interface board 28 can be in electrical communication with tester pin electronics 34 physically located in the test head 30. The tester pin electronics 34 provide separate electrical paths 36 from the test circuitry 32 contained in the tester 26, to the prober interface board 28. As will be further explained, the prober interface board 28 is also in electrical communication with electrical connectors 38 configured to electrically contact the pin contacts 22.

Figure 5B:
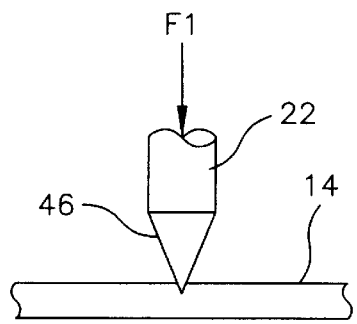
FIG. 5 is a cross sectional view taken along section line 5—5 of FIG. 4 illustrating pin contacts of the probe card in electrical communication with spring loaded electrical connectors.
FIG. 5A is an enlarged cross sectional view of an opening and pin contact for the probe card.
Figure 5A:
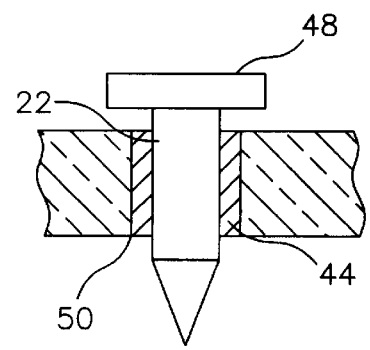
Figure 5:
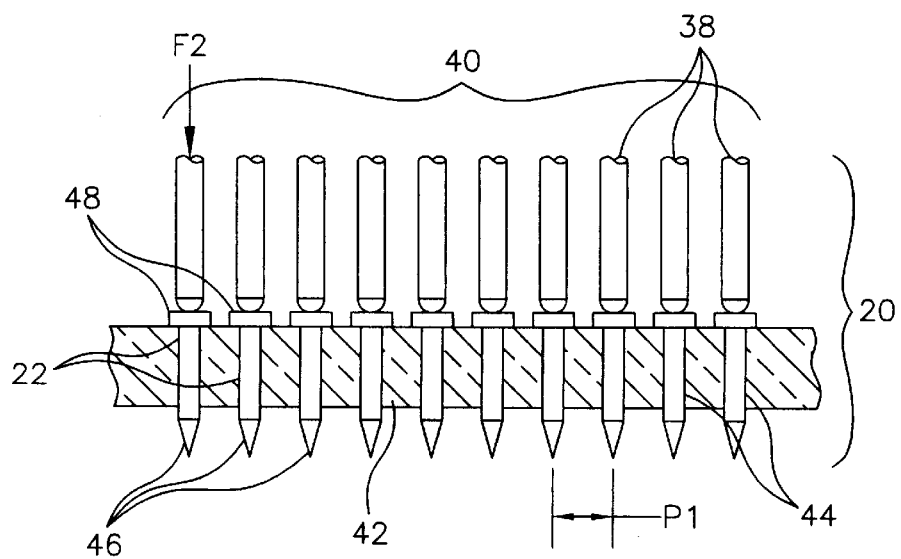

Referring to FIGS. 4 and 5, further details of the probe card 20 are illustrated. The probe card 20 includes a substrate 42 (FIG. 5) with patterns of openings 44 for mounting the pin contacts 22. In addition, the probe card 20 includes a force applying member 40 (FIG. 5) for biasing the pin contacts 22 against the die contacts 14.

As shown in FIG. 4, the pin contacts 22 on the probe card 20 are arranged in patterns corresponding to the patterns of the die contacts 14. Each pattern of contacts 22 represents a single test site. In FIG. 4, four separate test sites TS1–TS4 are illustrated. However, this number of test sites is merely exemplary, and a fewer or greater number of test sites can be included on the probe card 20. During a test procedure using the probe card 20, stepping techniques can be used to step the wafer 10, or the probe card 20 to test groups of dice 12 until all of the dice 12 have been tested.

The substrate 42 of the probe card 20 comprises a rigid material that is able to resist buckling and deformation during testing processes using the probe card 20. Suitable materials for the substrate 42 include ceramic, silicon, photosensitive glass-ceramic, and glass filled resins. The patterns of openings 44 are formed in the substrate 42 using a process that permits a pitch P1 of the pin contacts 22 to match a pitch P2 (FIG. 2) of the die contacts 14. For example, ceramic, silicon, and photosensitive glass can be patterned using a photolithographic process and etched with a wet etchant to form the openings 44. Depending on the substrate material, and the necessary tolerances, the openings 44 can also be mechanically machined, laser machined, or molded integrally with the substrate.

Also with ceramic materials, the substrate 42 can comprise a unitary block, or multiple layers fabricated using a high temperature lamination process. With photosensitive glass ceramics, commercially available photosensitive materials and fabrication processes, are marketed by Corning under the trademarks "FOTOFORM" and "FOTOCERAM".

Using fabrication processes that are known in the art, the openings 44 can be formed with a pitch and outside diameter as small as 1–2 mils. However, for most applications the diameter and pitch of the openings 44 can be larger than 1–2 mils, because the diameter and pitch of the die contacts 14 will be larger. In addition, for the embodiment shown in FIG. 5, the spring loaded electrical connectors 38 cannot be provided with diameters less than about 10 mils, and therefore require mounting on a pitch of about 15 mils.

Preferably the pin contacts 22 are formed of a relatively hard metal able to resist wear and oxidation with extended use. Suitable metals for the pin contacts 22 include titanium, palladium, copper, nickel alloys, spring steel alloys, copper alloys, "PALINEY 7", and plated metal over spring base metal. The pin contacts 22 can be formed by processes that are known in the art such as by nail heading wire. The pin contacts 22 can be provided with a diameter that is slightly less than the diameter of the openings 44 (e.g., several microns). The pin contacts 22 are thus able to freely move axially in the Z-direction, along a longitudinal axis of the openings 44.

As shown in FIG. 5A, the openings 44 can also include a bearing surface 50 sized to allow the pin contacts 22 to move freely in the Z-direction but to maintain a precise X and Y axis location. A metal bearing surface 50 can be formed by plating the openings 44 using an electroless or electrochemical deposition process. The same metals can be used to fabricate the bearing surfaces 50 as previously identified for the pin contacts 44.

Referring again to FIG. 5, the pin contacts 22 can include an enlarged head portion 48, to provide a larger surface area for physical contact with the electrical connectors 38. The electrical connectors 38 can be commercially available spring loaded electrical connectors, such as "POGO PINS" manufactured by Pogo Industries of Kansas City, Kans. Other suitable spring loaded electrical connectors include "DURASEAL" connectors manufactured by IDI, Kansas City, Kans.

As previously stated, the electrical connectors 38 are in electrical communication with the prober interface board 28. In the embodiment of FIG. 5, the electrical connectors 38 not only form separate electrical paths between the pin contacts 22 and the tester 26, but are also a component of the force applying mechanism 40 for pressing the pin contacts 22 into the die contacts 14. The force applying mechanism 40 also includes a support member 52 (FIG. 3) for mounting the electrical connectors 38. The support member 52 (FIG. 3) can be mounted to the test head 30 of the wafer handler 18.

As shown in FIG. 5B, tip portions 46 of the pin contacts 22 can be pointed to allow penetration of the die contacts 14 (FIG. 2). The force F1 (FIG. 5B) with which the pin contacts 22 press into the die contacts 14 is substantially equal to the force F2 (FIG. 5) with which the electrical connectors 38 press against the pin contacts 22 (i.e., F1=F2). However, the force F1 must be controlled such that the pointed tip portions 46 of the pin contacts 22 do not completely penetrate the die contacts 14. Typical thin film aluminum bond pads have a thickness of only about 1–1.5 $\mu$m. Accordingly the penetration depth of the pin contacts 22 must be limited to less that this thickness.

The force F2 exerted by the force applying member 40 will be dependent on a spring constant, and amount of compression, of the spring components of the electrical connectors 38. A representative value for the forces F1 and F2 can be from 0.10 oz to 1.5 oz per connector 38. To achieve these values, the wafer chuck 24 (FIG. 3) can be controlled to move the die contacts 14 (FIG. 2) on the wafer 10 (FIG. 3) into contact with the pin contacts 22 (FIG. 3) with a desired amount of overdrive in the Z-direction. As used herein the term Z-direction overdrive refers to movement of the wafer 10 or probe card 20 towards one another past the initial point of contact between the pin contacts 22 and die contacts 14.

The Z-direction overdrive determines the amount of compression in the spring components of the electrical connectors 38 and thus the magnitude of the force F2. In addition the Z-direction overdrive allows the pin contacts 22 to self center in the Z-direction to accommodate differences in the planarity, or vertical location of the die contacts 14. A representative amount of Z-direction overdrive can be from 0.25 mils to 3 mils.

Figure 6:
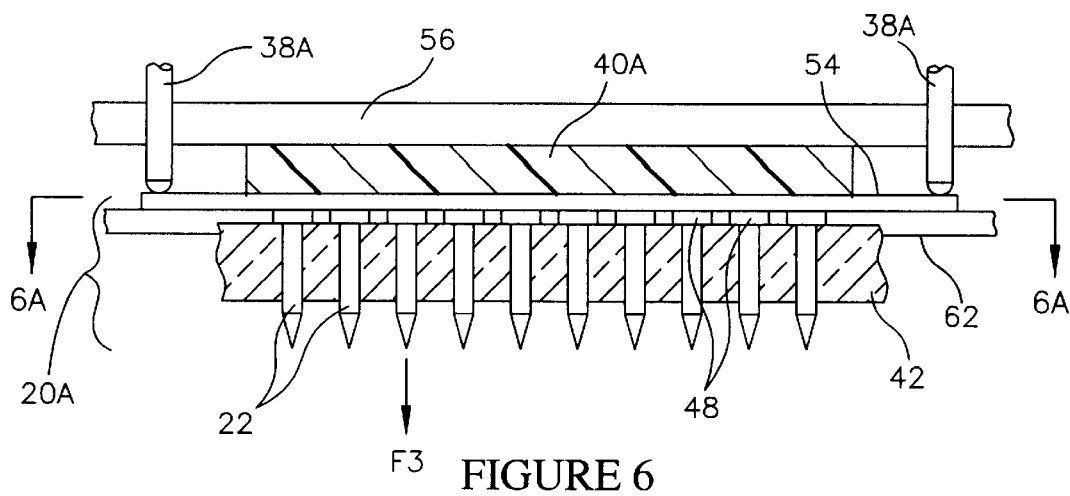
FIG. 6 is a cross sectional view equivalent to FIG. 5 illustrating an alternate embodiment probe card.
Figure 6A:
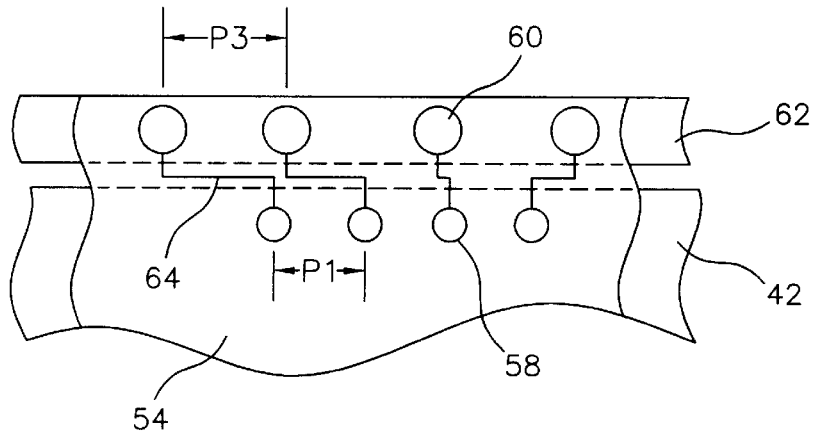
FIG. 6A is an enlarged cross sectional view taken along section line 6A—6A of FIG. 6 through a flex circuit of the probe card illustrating the fanning out of electrical connections to the pin contacts.

Referring to FIGS. 6 and 6A, an alternate embodiment probe card 20A is illustrated. The probe card 20A includes a substrate 42 and pin contacts 22 formed substantially as previously described. In addition, the probe card 20A includes a force applying member 40A and a flex circuit 54 for forming electrical connections to the pin contacts 22. The function of the force applying member 40A is to bias the pin contacts 22 against the die contacts 14. The function of the flex circuit 54 is to make and fan out electrical connections with the pin contacts 22.

The force applying member 40A can be attached to a support plate 56 mounted to the probe interface board 28 of the test head 30 (FIG. 3). The force applying member 40A comprises a compressible polymeric material such as silicone, butyl rubber, or fluorosilicone. Suitable polymeric materials include "PORON" and "BISCO" available from a Dow Chemical subsidiary. A representative thickness for the force applying member 40A can be from 0.5 mm to 4 mm. A peripheral outline of the force applying member 40A can correspond to a peripheral outline of a single test site on the substrate 42 (e.g., TS1–TS4-FIG. 4). Accordingly, each pin contact 22 for a particular test site can be biased by the same force applying member 40A. Alternately, the force applying member 40A can have a peripheral outline corresponding to multiple test sites.

Also, rather than being formed of elastomeric materials, the force applying member 40A can be formed as a compressible gas filled bladder. This type of bladder is available from Paratech of Frankfort, Ill. under the trademark "MAXI FORCE AIR BAG". The force applying member 40A can also be formed as a. heat conductive material such as a metal filled elastomer (e.g., silver filled silicone) to dissipate heat generated by the wafer 10 during test procedures.

The flex circuit 54 can comprise a multi layered TAB tape, such as "ASMAT" manufactured by Nitto Denko. This type of tape can include a polyimide substrate (not shown) on which patterns of conductors 64 (FIG. 6A) are formed. The flex circuit 54 can be attached to the force applying member 40A using an adhesive, or merely placed in physical contact with the force applying member 40A.

As shown in FIG. 6A, the flex circuit 54 includes contact members 58 for making separate electrical connections with the pin contacts 22. The contact members 58 can be metal bumps or flat pads. The contact members 58 can be bonded to the head portions 48 of the pin contacts 22 using a reflowed metal (e.g., solder), or a cured conductive elastomer. Alternately, the contact members 58 and pin contacts 22 can be shaped for mating electrical engagement without bonding. A pitch P1 of the contact members 58 on the flex circuit 54 matches the pitch P1 of the pin contacts 22.

The flex circuit 54 also includes contact pads 60 in electrical communication with the conductors 64 and with the contact members 58. The contact pads 60 are configured for electrical engagement with electrical connectors 38A. The electrical connectors 38A can be spring loaded electrical connectors substantially as previously described for connectors 38. However, in this embodiment the electrical connectors 38A only perform an electrical function and not a force applying function. The electrical connectors 38A can be mounted to the support plate 56 in electrical communication with the prober interface board 28 (FIG. 3) and test circuitry 32 (FIG. 3). In addition, another support plate 62 can be mounted to the test head 30 (FIG. 3) to support the flex circuit 54 and contact pads 60 for engagement by the electrical connectors 38A.

A pitch P3 of the contact pads 60 on the flex circuit 54 can be greater than the pitch P1 of the contact members 58 and the pin contacts 22 (i.e., P3>P1). The pitch P3 can thus be relatively large (e.g., 20 mils) to accommodate the electrical connectors 38A, while the pitch P1 can be relatively small (e.g., 2 mils) to allow the pin contacts 22 to be closely spaced for testing dense arrays of die contacts 14 (FIG. 2). The flex circuit 54 thus functions to fan out the electrical paths to the pin contacts 22.

During a test procedure using the probe card 20A, the wafer chuck 24 (FIG. 3) can be operated to align the pin contacts 22 with the die contacts 14 (FIG. 2). The wafer chuck 24 (FIG. 3) can then be used to place the pin contacts 22 into physical and electrical engagement with the die contacts 14. As before, the wafer 10 can be overdriven in the Z-direction to move the wafer 10 and probe card 20A closer than the initial point of contact of the pin contacts 22 and die contacts 14. The Z-axis overdrive compresses the force applying member 40A and presses the pin contacts 22 into the die contacts 14 to a limited penetration depth. In this case the force F3 applied by pin contacts 22 to the die contacts 14 is a function of the compressibility and spring constant of the material used to construct the force applying member 40A. The material of the force applying member 40A can be selected such that the force F3 is from about 0.10 oz to 1.5 oz. This insures a limited penetration depth into the die contacts 14 by the pin contacts 22.

Figures 7A, 7B:
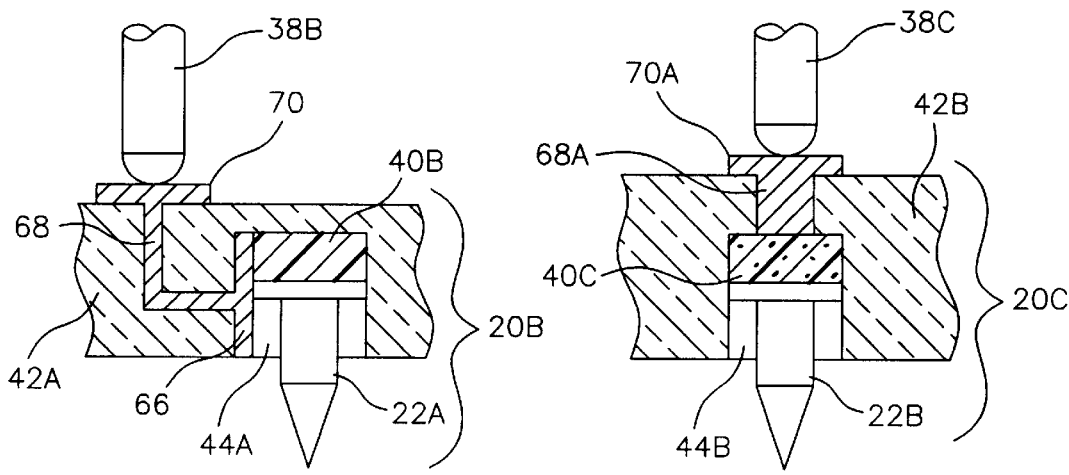
FIG. 7A is an enlarged cross sectional view of an alternate embodiment probe card.
FIG. 7B is an enlarged cross sectional view of an alternate embodiment probe card.

Referring to FIG. 7A, an alternate embodiment probe card 20B is illustrated. The probe card 20B includes a substrate 42A and pin contacts 22A substantially equivalent to the substrate 42 (FIG. 5) and pin contacts 22 (FIG. 5) previously described. In addition, the probe card 20B includes openings 44A wherein the pin contacts 22A are slidably mounted. The openings 44A can be formed using an etching or machining process as previously described for openings 44 (FIG. 5). However, the openings 44 do not extend completely through the substrate 42A but are closed at one end.

The probe card 20B also includes force applying members 40B mounted within the openings 44A. Each pin contact 22A has an associated force applying member 40B. The force applying members 40B can be formed of the materials previously described for force applying member 40A (FIG. 6). In addition, the force applying members 40B function to bias the pin contacts 22A into physical and electrical engagement with the die contacts 14, substantially as previously described for force applying member 40A (FIG. 6).

The probe card 20B also includes internal contacts 66 formed within the openings 44A. The internal contacts 66 function to electrically contact the pin contacts 22A. The internal contacts 66 can comprise a metal deposited within the openings 44A and shaped to physically engage portions of the pin contacts 22A. The internal contacts 66 are in electrical communication with internal conductors 68 and external contacts 70 on the substrate 42A. With the substrate 42A formed of a ceramic material, the internal conductors 68, internal contacts 66 and external contacts 70 can be fabricated using a metallization and ceramic lamination process. The external contacts 70 are configured for electrical engagement with electrical connectors 38B, substantially as previously described.

Referring to FIG. 7B, an alternate embodiment probe card 20C is illustrated. The probe card 20C includes a substrate 42B and pin contacts 22B substantially equivalent to the substrate 42A (FIG. 7A) and pin contacts 22A (FIG. 7A) previously described. In addition, the probe card 20B includes openings 44B, substantially equivalent to the openings 44A (FIG. 7A) previously described. The pin contacts 22B are slidably mounted within the openings 44B.

The probe card 20C also includes force applying members 40C that function substantially as previously described for force applying members 40B (FIG. 7A). However, in this embodiment the force applying members 40C comprise an electrically conductive polymer. The force applying members 40C can be an isotropic conductive material, such as silver filled silicone, or an anisotropic material such as a Z-axis anisotropic adhesive, or wire filled polymer (e.g., "SHINITSU" film). With an electrically conductive polymer, the force applying members 40C can be placed in electrical communication with internal conductors 68A and external contacts 70A. As before, the external contacts 70A are configured for electrical engagement with mating electrical connectors 38C.

Referring to FIG. 8 broad steps in a test method using the system 18 with the probe card 20 are illustrated.

Provide a wafer handler 18 and tester 26 for applying test signals for testing semiconductor dice 12 contained on a wafer 10.

Provide a probe card 20 for the wafer handler 18 having slidably mounted pin contacts 22 and a force applying member 40 for biasing the pin contacts 22.

Load the wafer 10 into the wafer handler 18.

Align die contacts 14 on the wafer 10 with the pin contacts 22 on the probe card 20 by moving the wafer 10 or the probe card 20 in X and Y directions.

Move the wafer 10 or the probe card 20 in the Z-direction to place the die contacts 14 and the pin contacts 22 in physical contact.

Overdrive the wafer 10 or the probe card 20 in the Z-direction by a selected distance so that the pin contacts 22 penetrate the die contacts 14 under biasing from the force applying member 40.

Compress the force applying member 40 by the selected distance to exert a desired force on the pin contacts 22 for penetrating the die contacts 14 to a limited penetration depth.

Transmit test signals through pin contacts 22 to die contacts 14.

Thus the invention provides a probe card for testing semiconductor wafers, and a test method and test system employing the probe card. Although preferred materials have been described, it is to be understood that other materials may also be utilized. Furthermore, although the method of the invention has been described with reference to certain preferred embodiments, as will be apparent to those skilled in the art, certain changes and modifications can be made without departing from the scope of the invention as defined by the following claims.

We claim:

1. A probe card for testing a semiconductor wafer having a plurality of contacts in a first pattern comprising:

a substrate comprising a plurality of openings in a second pattern matching the first pattern;

a plurality of electrically conductive pins configured to electrically engage the contacts, each pin slidably mounted within an opening and comprising a tip portion configured to penetrate a contact on the wafer; and a force applying member configured to bias the pins against the contacts with a force, the force applying member and the pins configured such that the pins can move axially within the openings to penetrate the contacts and to accommodate differences in a planarity of the contacts.

2. The probe card of claim 1 further comprising a flex circuit on the substrate comprising a plurality of first contacts in electrical communication with the pins and a plurality of second contacts configured for electrical communication with a plurality of electrical connectors.

3. The probe card of claim 1 wherein the force applying member comprises a compressible pad.

4. The probe card of claim 1 wherein the force applying member comprises a compressible pad on the substrate in physical contact with the pins.

5. A probe card for testing a semiconductor wafer having a plurality of contacts in a first pattern comprising:

a substrate comprising a plurality of openings in a second pattern matching the first pattern;

a plurality of electrically conductive pins slidably mounted within the openings comprising tip portions configured to electrically engage the contacts;

a flex circuit on the substrate comprising a plurality of first contacts in physical and electrical contact with the pins and a plurality of second contacts in electrical communication with the first contacts configured for electrical contact with a plurality of electrical connectors; and a force applying mechanism in physical contact with the flex circuit configured to bias the pins against the contacts, the force applying mechanism and the pins configured such that the pins move freely within the openings to accommodate differences in a planarity of the contacts.

6. The probe card of claim 5 wherein the force applying mechanism comprises a compressible pad on the substrate in physical contact with the pins.

7. The probe card of claim 5 wherein each pin comprises a pointed tip portion for penetrating a contact and a head for engaging the force applying mechanism.

8. In a test system for testing a semiconductor wafer having a plurality of contacts in a first pattern, the test system comprising a tester for generating test signals, a wafer handler for handling the wafer, and a plurality of electrical connectors on the wafer handler in electrical communication with the tester, a probe card for transmitting the test signals to the wafer comprising:

a substrate on the wafer handler comprising a plurality of openings in a second pattern matching the first pattern;

a plurality of electrically conductive pins slidably mounted to the openings comprising tip portions configured to electrically engage the contacts on the wafer; and a flex circuit comprising a plurality of first contacts in physical and electrical contact with the pins and a plurality of second contacts in electrical communication with the first contacts configured for electrical contact by the electrical connectors; and a force applying mechanism comprising a compressible pad on the wafer handler in physical contact with the flex circuit configured to bias the pins against the contacts, the force applying mechanism, the flex circuit and the pins configured such that the pins can move with the pad and with the flex circuit such that the tip portions penetrate the contacts.

9. The probe card of claim 8 wherein the first contacts have a first pitch and the second contacts fan out with a second pitch that is greater than the first pitch.

10. The probe card of claim 8 wherein the electrical connectors comprise springs.

11. A probe card for testing a semiconductor wafer having a plurality of contacts separated by a pitch P1 comprising:

a substrate comprising a plurality of openings separated by the pitch P1;

a plurality of electrically conductive pins slidably mounted to the openings comprising tip portions configured to make electrical connections with the contacts on the wafer;

a flex circuit comprising a first set of contacts in electrical communication with the pins, and a second set of contacts in electrical communication with the first set of contacts configured for electrical communication with a plurality of electrical connectors and separated by a pitch P2 which is greater than the pitch P1; and a compressible pad proximate to the flex circuit configured to bias the pins against the wafer with a biasing force and to allow the pins to move with the pad and with the flex circuit to accommodate differences in a planarity of the contacts as the tip portions penetrate the contacts.

12. The probe card of claim 11 wherein the pins comprise enlarged head portions in physical contact with the first set of contacts and pointed tip portions for penetrating the contacts.

13. The probe card of claim 11 wherein each pin is movable alone a longitudinal axis of a corresponding opening.

14. In a test system for testing a semiconductor wafer having a plurality of contacts in a first pattern, the test system comprising a tester for generating test signals, a wafer handler for handling the wafer, and a plurality of electrical connectors on the wafer handler in electrical communication with the tester, a probe card for transmitting the test signals to the wafer comprising:

a substrate comprising a plurality of openings in a second pattern matching the first pattern;

a plurality of electrically conductive pins slidably mounted to the openings comprising tip portions configured to electrically engage the contacts;

a flex circuit on the substrate comprising a plurality of conductors in electrical communication with the pins, and a plurality of external contacts configured for electrical contact with the electrical connectors; and a compressible pad proximate to the flex circuit configured to bias the pins against the contacts with a force dependent on a Z-axis overdrive of the wafer by the wafer handler, the pad, the flex circuit and the pins configured such that the pins can move with the pad and with the flex circuit to accommodate different z-direction locations of the contacts as the tip portions penetrate the contacts.

15. The probe card of claim 14 wherein the flex circuit comprises a multi layered tape on the substrate.

16. The probe card of claim 14 wherein the conductors have a fan out configuration to the external contacts.

* * * * *